(12) United States Patent
Sugawara (10) Patent No.: US 7,839,714 B2
(45) Date of Patent: Nov. 23, 2010

(54) NON-VOLATILE SEMICONDUCTOR STORAGE DEVICE AND WORD LINE DRIVE METHOD

(75) Inventor: Hiroshi Sugawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 30 days.

(21) Appl. No.: 11/819,746

(22) Filed: Jun. 28, 2007

(65) Prior Publication Data
US 2008/0043538 A1 Feb. 21, 2008

(30) Foreign Application Priority Data
Jun. 29, 2006 (JP) ............... 2006-180072

(51) Int. Cl.
G11C 8/00 (2006.01)
G11C 7/00 (2006.01)
G11C 5/14 (2006.01)

(52) U.S. Cl. .................. 365/230.06; 365/189.11; 365/226

(58) Field of Classification Search ............ 365/189.11, 365/226, 230.06
See application file for complete search history.

(56) References Cited

U.S. PATENT DOCUMENTS

| | | | | |
|---|---|---|---|---|
| 5,781,498 A * | 7/1998 | Suh | ............ | 365/189.11 |
| 5,835,439 A * | 11/1998 | Suh | ............ | 365/189.11 |
| 6,233,198 B1 * | 5/2001 | Choi | ............ | 365/189.11 |
| 6,418,075 B2 * | 7/2002 | Shimano et al. | ........ | 365/189.11 |
| 6,421,295 B1 * | 7/2002 | Mao et al. | ............ | 365/189.11 |
| 6,535,430 B2 * | 3/2003 | Ogura et al. | ........... | 365/189.11 |
| 6,665,229 B2 * | 12/2003 | Lee et al. | ............ | 365/189.11 |
| 7,440,354 B2 * | 10/2008 | Liston et al. | ........... | 365/189.11 |

FOREIGN PATENT DOCUMENTS

| | | |
|---|---|---|
| JP | 10-3794 | 1/1998 |
| JP | 2001-43693 | 2/2001 |
| JP | 2005-317138 | 11/2005 |

* cited by examiner

Primary Examiner—Trong Phan
(74) Attorney, Agent, or Firm—McGinn IP Law Group, PLLC (57) ABSTRACT

A non-volatile semiconductor storage device, includes a memory array including memory cells, a plurality of word lines installed in the memory array, a sub-decoder including a pull-up power line, a pull-down power line and a plurality of drivers, a pre-decoder coupled to the sub-decoder, and generating a pre-decode signal; and a main decoder coupled to the sub-decoder, and generating a main decode signal. A potential of the pull-up power line and a potential of the pull-down power line are controlled in response to the main decode signal. The plurality of drivers drives the plurality of word lines in response to the pre-decode signal. Each of the plurality of drivers comprises a first transistor including a first node which is coupled to the pull-up power line, a second node which is coupled to one of the plurality of word lines and a third node which is supplied with the pre-decode signal, and a second transistor including a fourth node which is coupled to the pull-down power line, a fifth node which is coupled to the second node and a sixth node which is supplied to the pre-decode signal. The pre-decoder pulls down the pre-decode signal to a negative potential lower than a ground potential.

20 Claims, 9 Drawing Sheets

FIG. 1

(Prior Art)

NON-VOLATILE SEMICONDUCTOR STORAGE DEVICE AND WORD LINE DRIVE METHOD

BACKGROUND OF THE INVENTION

1. Field of the Invention

The present invention relates to a non-volatile semiconductor storage device which stores data by accumulating charges in a floating gate of each memory cell. More particularly, the present invention relates to an improved technique for driving word lines of such a non-volatile semiconductor storage device using a hierarchical word line drive circuit.

2. Description of Related Art

Control gates are generally used as word lines in non-volatile semiconductor storage devices such as flash memories and EEPROMs (electrically erasable programmable read-only memories) which are configured to store data by accumulating charges in a floating gate of each memory cell. By applying an appropriate voltage to a word line (i.e., control gate), it is possible to program, erase, or read desired data to/from each memory cell.

Recent non-volatile semiconductor storage devices are configured such that both positive and negative potentials can be applied to word lines as disclosed in Japanese Patent Laid-Open No. 2005-317138. Such a configuration makes it possible to downsize gates of transistors which compose memory cells and word line drive circuits, and thereby downsize the non-volatile semiconductor storage devices.

Another trend in recent non-volatile semiconductor storage devices is hierarchical design of word line drive circuits. The recent non-volatile semiconductor storage devices use hierarchical word line drive circuits to make it possible to drive a large number of word lines. For example, Japanese Patent Laid-Open No. 10-3794 discloses a hierarchical word line drive circuit consisting of block decoders, gate decoders, and sub-decoders.

One of requirements for a hierarchical word line drive circuit is that the drivers in the final word line drive stage have a simple configuration. There are as many drivers in the final stage as there are word lines, and thus simplification of driver configuration in the final stage is very useful in downsizing the word line drive circuit.

Figure 1:
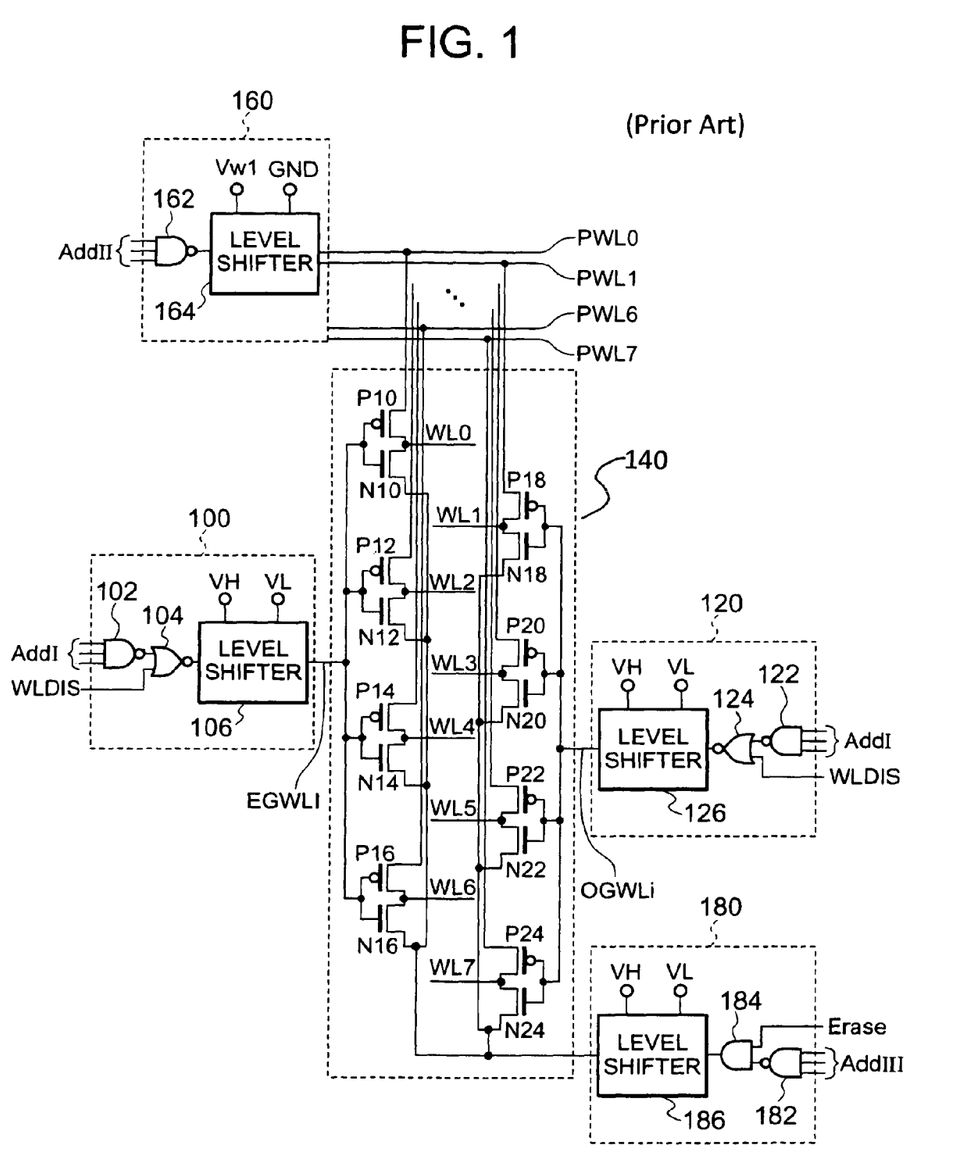
FIG. 1 is a circuit diagram showing a configuration of a conventional word line drive circuit of a non-volatile semiconductor storage device.

Japanese Patent Laid-Open No. 2001-43693 discloses a hierarchical word line drive circuit in which drivers in the final word line drive stage consists of two MOS transistors. FIG. 1 is a circuit diagram showing a configuration of the word line drive circuit disclosed in the patent document. The word line drive circuit shown in FIG. 1 has an even-numbered global decoder 100, odd-numbered global decoder 120, row local decoder 140, row partial decoder 160, and block decoder 180.

The even-numbered global decoder 100 has a NAND gate 102, NOR gate 104, and level shifter 106 and drives an even-numbered global word line EGWLi. The odd-numbered global decoder 120 has a NAND gate 122, NOR gate 124, and level shifter 126 and drives an odd-numbered global word line OGWLi.

The row local decoder 140 is a circuit which drives local word lines WLi connected to memory cells (not shown). The row local decoder 140 consists of PMOS transistors P10 to P24 and NMOS transistors N10 to N24. The row partial decoder 160 has a NAND gate 162 and level shifter 164 and generates word line selection signals PWL0 to PWL7. The block decoder 180 has a NAND gate 182, AND gate 184, and level shifter 186 and supplies the row local decoder 140 with a negative voltage used for erasing operations.

With the word line drive circuit in FIG. 1, each local word line is driven by a driver consisting of two MOS transistors (one PMOS transistor and one NMOS transistor). For example, the local word line WL0 is driven by a driver consisting of the PMOS transistor P10 and NMOS transistor N10 while the local word line WL1 is driven by a driver consisting of the PMOS transistor P11 and NMOS transistor N11.

The word line drive circuit in FIG. 1 operates as follows in write operations. An operation performed when the local word line WL2 is selected will be described below. When the write operations are performed, the even-numbered global decoder 100 drives the even-numbered global word line EGWLi at 0 V. Consequently, the PMOS transistors P10 to P16 turn on and the NMOS transistors N10 to N16 turn off. On the other hand, the odd-numbered global decoder 120 drives the odd-numbered global word line OGWLi at 10 V. Consequently, the PMOS transistors P10 to P16 turn off and the NMOS transistors N10 to N16 turn on. The row partial decoder 160 sets the word line selection signal PWL2 at 10 V and sets the remaining word line selection signals PWL0, PWL1, and PWL3 to PWL7 at ground potential. The block decoder 180 generates a 0 V potential.

Consequently, the local word line WL2 is electrically connected to the word line selection signal PWL2 with a potential of 10 V via the PMOS transistor P12, and is driven at 10 V.

In read operations, the word line drive circuit in FIG. 1 operates in the same manner as in write operations except that a voltage of 5 V is used instead of 10 V.

A feature of the word line drive circuit in FIG. 1 is that each local word line is driven by only two MOS transistors. This simple configuration is effective in reducing overall size of the word line drive circuit.

[Patent Document 1] Japanese Patent Laid-Open No. 2005-317138

[Patent Document 2] Japanese Patent Laid-Open No. 10-3794

[Patent Document 3] Japanese Patent Laid-Open No. 2001-43693

However, the word line drive circuit in FIG. 1 has a problem in that part of unselected local word lines is brought into a floating state. The local word lines WL1, WL3, WL5, and WL7, which are electrically connected to outputs of the block decoder 180 via the NMOS transistors N18, N20, N22, and N24, respectively, are driven at 0 V to be sure, but the local word lines WL0, WL4, and WL6 are brought into a floating state. Gate and source potentials of the PMOS transistors P10, P14, and P16 are all 0 V. Thus, the PMOS transistors P10, P14, and P16 do not turn on. Neither do the NMOS transistors N10, N14, and N16, as described above. Consequently, the local word lines WL0, WL4, and WL6 are cut off from outputs of both row partial decoder 160 and block decoder 180 and brought into a floating state.

In this regard, Japanese Patent Laid-Open No. 2001-43693 states that since the local word lines WL1, WL3, WL5, and WL7, which are electrically connected to outputs of the block decoder 180 via the NMOS transistors N18, N20, N22, and N24, respectively, are driven at 0 V, the local word lines WL0, WL4, and WL6 are electrically shielded, which prevents coupling among word lines.

However, it is not desirable from the viewpoint of stability of operation that local word lines, which are long and thick, enter a floating state. When local word lines enter a floating state, data may be read or written erroneously due to noise. Desirably, unselected local word lines are kept at a fixed potential (typically at ground potential).

SUMMARY OF THE INVENTION

To solve the above problems, the present invention takes the following measures. Incidentally, when describing technical matters composing these measures, the same reference numerals/characters as those used in DETAILED DESCRIPTION OF THE PREFERRED EMBODIMENTS are attached to clarify correspondence between description provided in the appended claims and description provided in DETAILED DESCRIPTION OF THE PREFERRED EMBODIMENTS. However, it should be understood that the attached reference numerals/characters are not intended to limit the scope of the present invention defined in the appended claims.

The present invention provides a non-volatile semiconductor storage device comprising: a memory array (1) containing memory cells which store data by accumulating charges in floating gates; word lines (WL_i_j) installed in the memory array (1) and used as control gates of the memory cells; a pre-decoder (3) which generates pre-decode signals (PX_i); a main decoder (4) which generates main decode signals (MX_j); and a sub-decoder (2). The sub-decoder (2) is equipped with pull-up power lines ($23_j$) whose potentials are controlled by the main decode signals (MX_j), a pull-down power line (24), and drivers (22) which drive word lines (WL_i_j) according to the pre-decode signals (PX_i). Each of the drivers (22) comprises a PMOS transistor (P3) whose source is connected with one of the pull-up power lines ($23_j$), whose drain is connected with one of the word lines (WL_i_j), and whose gate is supplied with an appropriate pre-decode signal (PX_i) as well as an NMOS transistor (N3) whose drain is connected with the drain of the PMOS transistor (P3), whose gate is supplied with the appropriate pre-decode signal (PX_i), and whose source is connected with the pull-down power line (24). The pre-decoder (3) can pull down the pre-decode signals (PX_i) to a negative potential lower than a ground potential.

The non-volatile semiconductor storage device configured as described above can reduce the size of the word line drive circuit because each driver consists of only two MOS transistors. Besides, when the pull-up power lines ($23_j$) are driven at the ground potential in response to the main decode signals (MX_j), the non-volatile semiconductor storage device can fix the word lines (WL_i_j) at the ground potential by pulling down the pre-decode signals (PX_i) to a negative potential lower than the ground potential. Thus, the non-volatile semiconductor storage device according to the present invention can prevent the word lines (WL_i_j) from entering a floating state.

The present invention provides a small-size word line drive circuit which can operate without bringing word lines into a floating state.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Overall Configuration

Figure 2:
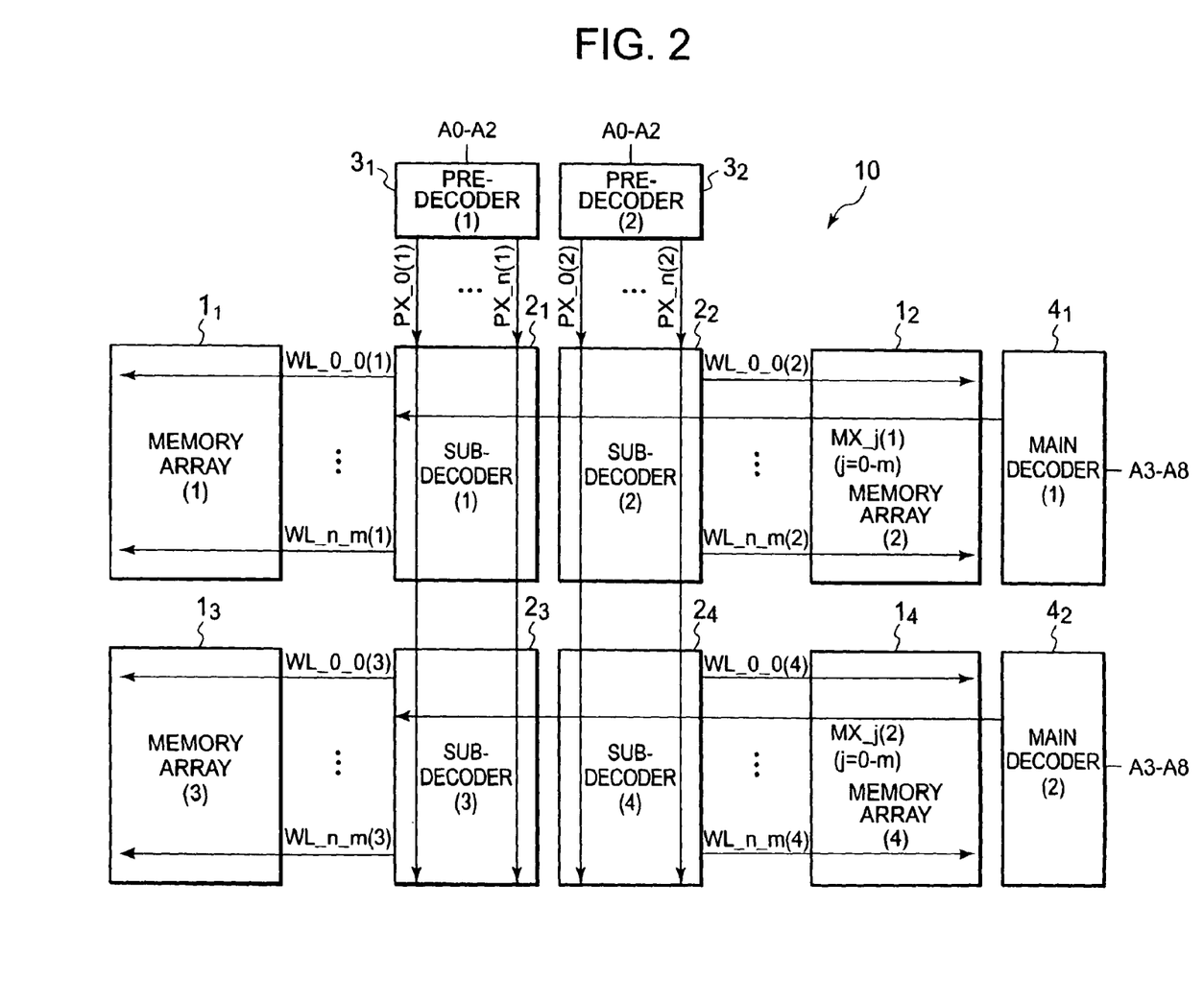
FIG. 2 is a block diagram showing a configuration of a non-volatile semiconductor storage device according to an embodiment of the present invention.

FIG. 2 is a block diagram showing a configuration of a non-volatile semiconductor storage device 10 according to an embodiment of the present invention. The non-volatile semiconductor storage device 10 has memory arrays $1_1$ to $1_4$, sub-decoders $2_1$ to $2_4$, pre-decoders $3_1$ and $3_2$, and main decoders $4_1$ and $4_2$. It should be noted that subscripts to reference characters/numerals may be omitted when there is no need to distinguish among a plurality of the same components. For example, memory arrays $1_1$ to $1_4$ may be referred to collectively as the memory array(s) 1.

The memory array 1 consists of memory cells arranged in a matrix and used to store data by accumulating charges in floating gates. It should be noted that the term "floating gate" is not limited to a conductive one such as polysilicon and includes insulators capable of holding charges, such as adopted in MONOS (metal oxide nitride oxide silicon) technology. Each memory array 1 has a plurality of word lines WL_0_0 to WL_n_m and bit lines (not shown). Hereinafter, the word lines WL_0_0 to WL_n_m will be referred to collectively as the word line(s) WL when they are not distinguished from each other. On the other hand, a numeral enclosed in parentheses will be used to clearly indicate a word line (or word lines) WL installed in a specific memory array 1. For example, word line WL_0_0 (1) denotes a word line installed in the memory array Each memory cell is installed at an intersection of a word line WL and bit line. The word line WL functions as a control gate of each memory cell.

The sub-decoder 2 drives a word line selected from among the word lines WL_0_0 to WL_n_m according to the pre-decode signals PX_0 to PX_n supplied from the pre-decoder 3 and the main decode signals MX_0 to MX_m supplied from the main decoder 4. Specifically, if the pre-decode signal PX_i and main decode signal MX_j are selected during a write operation or read operation, the sub-decoder 2 selects and pulls up the word line WL_i_j. As described later, in write operations, the selected word line is pulled up to a high potential VPOS (typically 10 V) and in read operations, the selected word line is pulled up to a power supply potential VCC (typically 5 V). On the other hand, in erase operations, the sub-decoder 2 pulls down all the word lines WL_0_0 to WL_n_m to a negative potential VNEG (typically −10 V).

The pre-decoder 3 selects the pre-decode signals PX_0 to PX_n for upper addresses A0 to A2 while the main decoder 4 selects the main decode signals MX_0 to MX_m for lower addresses A3 to A8. It should be noted that in FIG. 2, a set of main decode signals MX_0 to MX_m are supplied to multiple sub-decoders 2. According to this embodiment, main decode signals MX_0 (1) to MX_m (1) generated by the main decoder $4_1$ are supplied to two sub-decoders $2_1$ and $2_2$ while main decode signals MX_0 (2) to MX_m (2) generated by the main decoder $4_2$ are supplied to two sub-decoders $2_3$ and $2_4$.

Configurations of the sub-decoder 2, pre-decoder 3, and main decoder 4 will be described in detail below.

Configuration of Sub-Decoder 2

Figure 3:
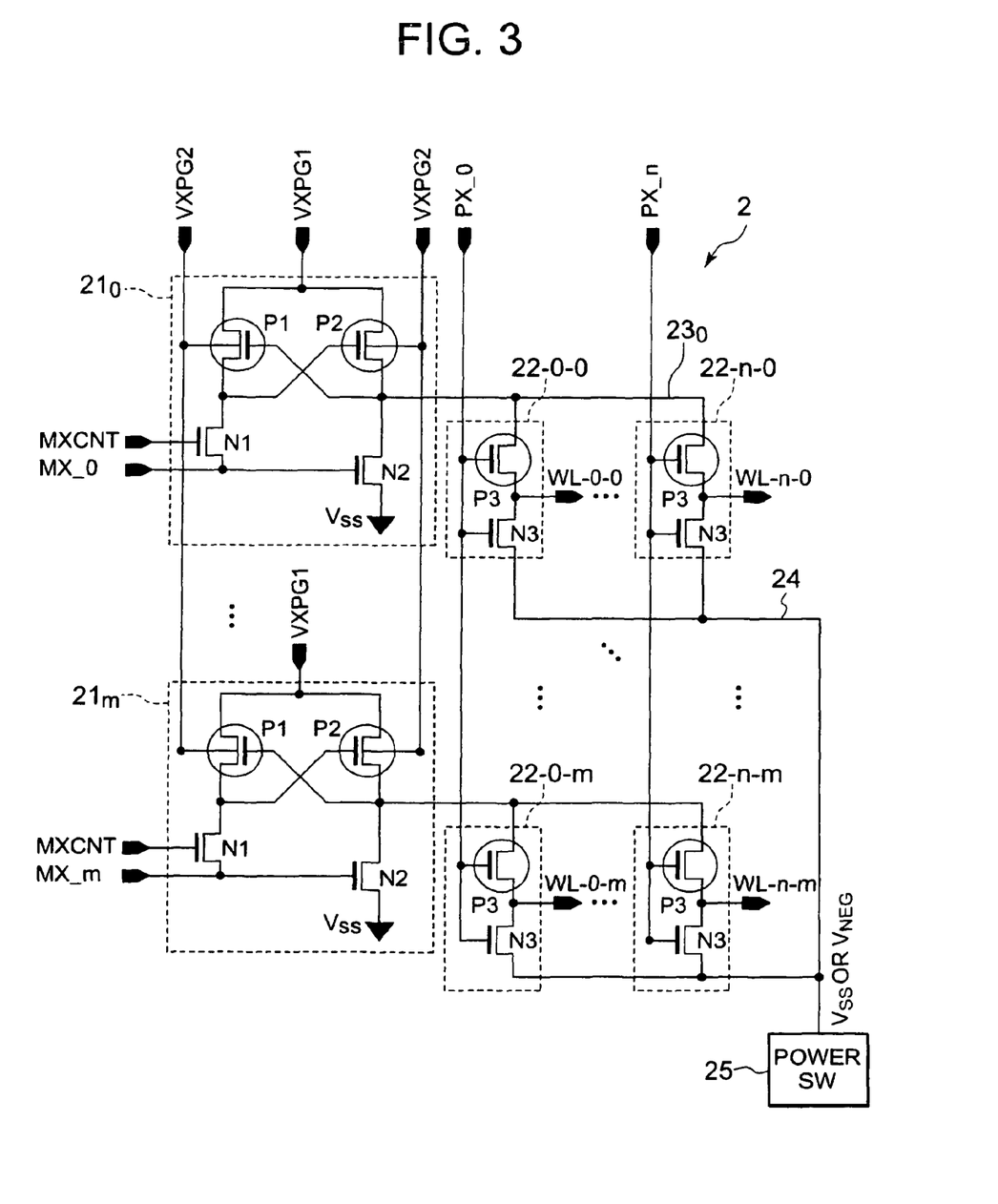
FIG. 3 is a circuit diagram showing a configuration of a sub-decoder according to the embodiment.

FIG. 3 is a circuit diagram showing a configuration of the sub-decoder 2. The sub-decoder 2 has m+1 level shifters $21_0$ to $21_m$, (n+1)×(m+1) drivers 22-0-0 to 22-$n$-$m$, pull-up power lines $23_0$ to $23_m$, a pull-down power line 24, and a power switch 25. The level shifters $21_0$ to $21_m$ will be referred to collectively as the level shifter(s) 21 when they are not distinguished from each other. In the same fashion, the drivers 22-0-0 to 22-$n$-$m$ will be referred to collectively as the driver(s) 22.

The level shifters $21_0$ to $21_m$ drive the pull-up power lines $23_0$ to $23_m$, respectively, in response to the main decode signals MX_0 to MX_m. The pull-up power lines $23_0$ to $23_m$ are wires used to distribute desired positive potentials (power supply potential VCC or high potential VPOS) to the drivers 22. The pull-up power line $23_0$ is connected to the drivers 22-0-0 to 22-$n$-0. Similarly, the pull-up power line $23_j$ is connected to the drivers 22-0-$j$ to 22-$n$-$j$. The potentials of the pull-up power lines $23_0$ to $23_m$ are controlled by the main decoder 4 using the main decode signals MX_0 to MX_m.

According to this embodiment, each level shifter 21 consists of PMOS transistors P1 and P2 and NMOS transistors N1 and N2. The drains of the PMOS transistors P1 and P2 are connected to the gates of the other PMOS transistors. The PMOS transistors P1 and P2 have their sources commonly connected to a power line VXPG1 and have their substrate terminals commonly connected to a power line VXPG2. The power lines VXPG1 and VXPG2 are driven at a high potential VPOS higher than the power supply potential VCC in write operations, and at the power supply potential VCC in read operations. The drain of the PMOS transistor P1 is connected to the drain of the NMOS transistor N1 while the drain of the PMOS transistor P2 is connected to the drain of the NMOS transistor N2. The gate of the NMOS transistor N1 is supplied with a predetermined control voltage MXCNT. The gate and source of the NMOS transistor N2 are supplied with a main decode signal from the main decoder 4. More specifically, the gate and source of the NMOS transistor N2 of the level shifter $21_j$ is supplied with the main decode signal MX_j. The source of the NMOS transistor N2 is connected to a ground terminal which has a ground potential VSS. The pull-up power lines 230 to 23$m$ are connected to the drains of the PMOS transistor P2 of the level shifters $21_0$ to $21_m$, respectively.

The drivers 22 constitute output stages which finally drive word lines in response to the pre-decode signals PX_0 to PX_n. Each driver 22 consists of two transistors: a PMOS transistor P3 and NMOS transistor N3. In the driver 22-$i$-$j$, the source of the PMOS transistor P3 is connected with the pull-up power line $23_j$ and the source of the NMOS transistor N3 is commonly connected with the pull-down power line 24. The gates of the PMOS transistor P3 and NMOS transistor N3 of the driver 22-$i$-$j$ are supplied with the pre-decode signal PX_i. The word line WL_i_j is connected to the drain of the PMOS transistor P3 and NMOS transistor N3 of the driver 22-$i$-$j$.

It should be noted that each driver 22 consists of only two MOS transistors. This con figuration is effective in reducing the size of the circuit used to drive the word lines.

The power switch 25 sets the pull-down power line 24 to the ground potential VSS or negative potential VNEG. More specifically, the power switch 25 sets the pull-down power line 24 (i.e., the source of the NMOS transistor N3) to the ground potential VSS in write and read operations, and sets the pull-down power line 24 to the negative potential VNEG in erase operations.

Configuration of Pre-Decoder 3

Figure 4:
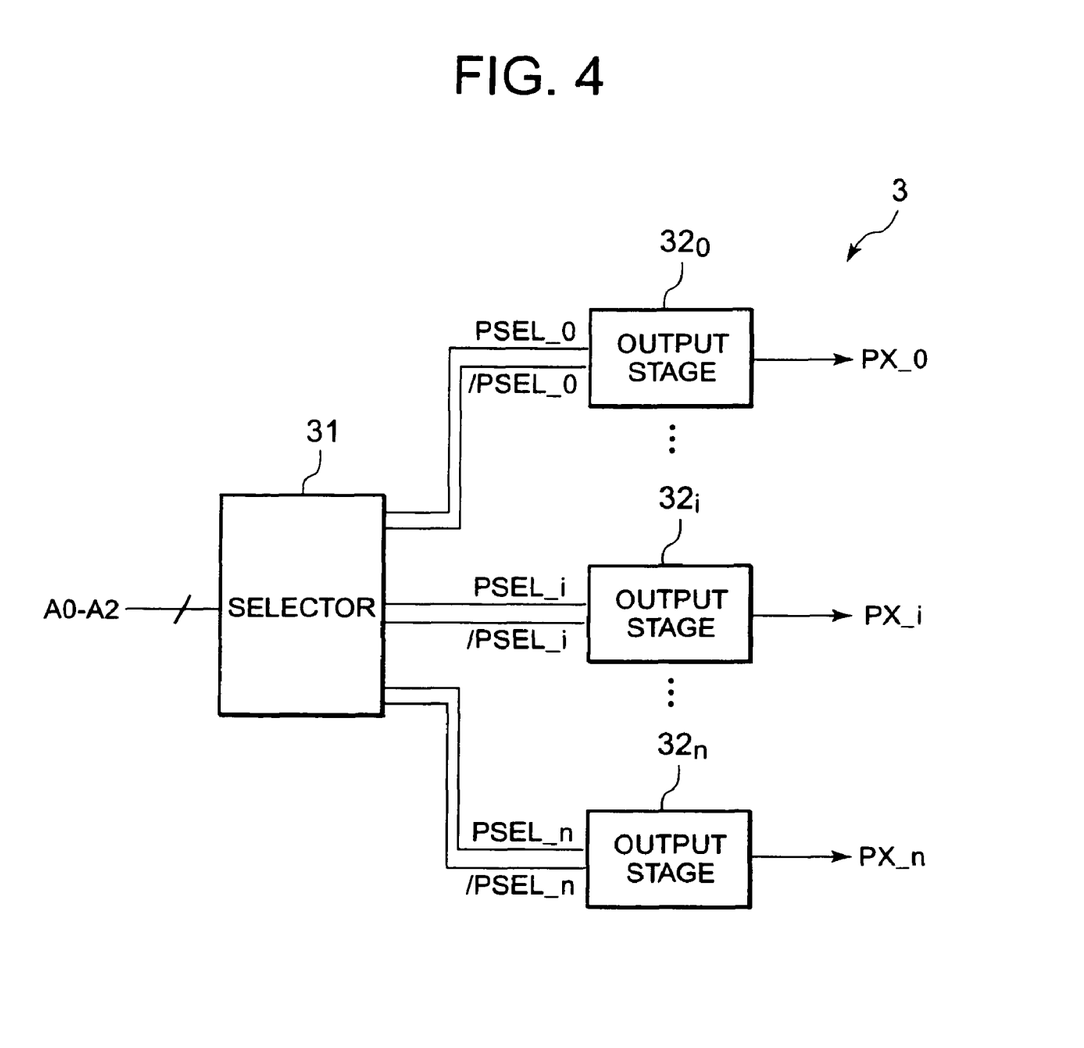
FIG. 4 is a block diagram showing a configuration of a pre-decoder according to the embodiment.

FIG. 4 is a block diagram showing a configuration of the pre-decoder 3. The pre-decoder 3 has a selector 31 and output stages $32_0$ to $32_n$. The selector 31 selects, the pre-decode signals PX_0 to PX_n for the upper addresses A0 to A2. Specifically, when selecting the pre-decode signal PX_i, the selector 31 activates complementary selection signals PSEL_i and /PSEL_i (i.e., it pulls up the selection signal PSEL_i to a "High" level and pulls down the selection signal /PSEL_i to a "Low" level). The output stage $32_i$ generates a pre-decode signal PX_i in response to the selection signals PSEL_i and /PSEL_i.

Figure 5:
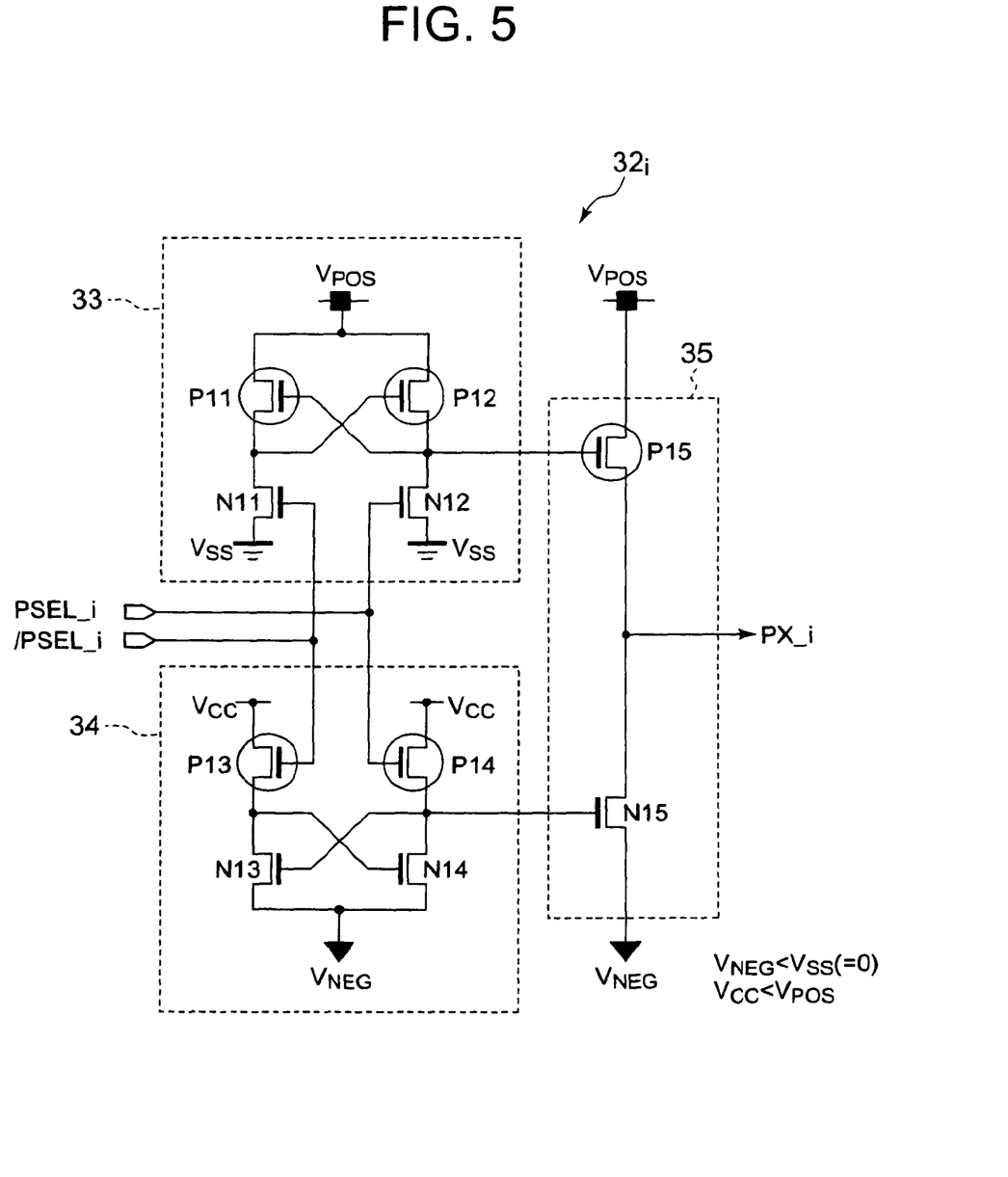
FIG. 5 is a circuit diagram showing a configuration of an output stage of the pre-decoder in FIG. 4.

FIG. 5 is a circuit diagram showing a configuration of the output stage $32_i$ of the pre-decoder 3. The output stage $32_i$ has a positive voltage level shifter 33, negative voltage level shifter 34, and buffer 35.

The positive voltage level shifter 33 outputs the high potential VPOS or ground potential VSS in response to the selection signal PSEL_i or /PSEL_i. According to this embodiment, the positive voltage level shifter 33 consists of PMOS transistors P11 and P12 and NMOS transistors N11 and N12. The gates of the PMOS transistors P11 and P12 are connected to the drains of the other PMOS transistors. The sources of the PMOS transistors P11 and P12 are commonly connected to a high voltage terminal which has the high potential VPOS. The drains of the PMOS transistors P11 and P12 are connected to the drains of the NMOS transistors N11 and N12, respectively. The gates of the NMOS transistors N11 and N12 are supplied with the selection signals PSEL_i and /PSEL_i, respectively. The sources of the NMOS transistors N11 and N12 are connected to a ground terminal which has the ground potential VSS.

On the other hand, the negative voltage level shifter 34 outputs the power supply potential VCC or negative potential VNEG in response to the selection signal PSEL_i or /PSEL_i. According to this embodiment, the negative voltage level shifter 34 consists of PMOS transistors P13 and P14 and NMOS transistors N13 and N14. The gates of the PMOS transistors P13 and P14 are connected to the drains of the other PMOS transistors. The gates of the PMOS transistors P13 and P14 are supplied with the selection signals /PSEL_i and PSEL_i, respectively. The sources of the PMOS transistors P13 and P14 are commonly connected to a power supply terminal which has power supply potential VCC. The drains of the PMOS transistors P13 and P14 are connected to the drains of the NMOS transistors N13 and N14, respectively. The sources of the NMOS transistors N13 and N14 are connected to a negative voltage terminal which has the negative potential VNEG.

The buffer 35 generates a pre-decode signal PX_i in response to outputs from the positive voltage level shifter 33 and negative voltage level shifter 34. According to this embodiment, the buffer 35 consists of a PMOS transistor P15 and NMOS transistor N15. The PMOS transistor P15 has its source connected to the high voltage terminal which has the high potential VPOS, and its gate connected to the output of the positive voltage level shifter 33. The PMOS transistor P15 has its drain connected to the drain of the NMOS transistor N15. The NMOS transistor N15 has its source connected to the negative voltage terminal which has the negative potential VNEG, and its gate connected to the output of the negative voltage level shifter 34.

When the pre-decode signal PX_i is selected for the addresses A0 to A2 (i.e., when the selection signals PSEL_i and /PSEL_i are activated), the pre-decoder 3 configured as described above pulls down the pre-decode signal PX_i to the negative potential VNEG. When the pre-decode signal PX_i is unselected, the pre-decoder 3 pulls up the pre-decode signal PX_i to the high potential VPOS. It should be noted that according to this embodiment, the pre-decode signal PX_i is an active low signal.

Configuration of Main Decoder 4

Figure 6:
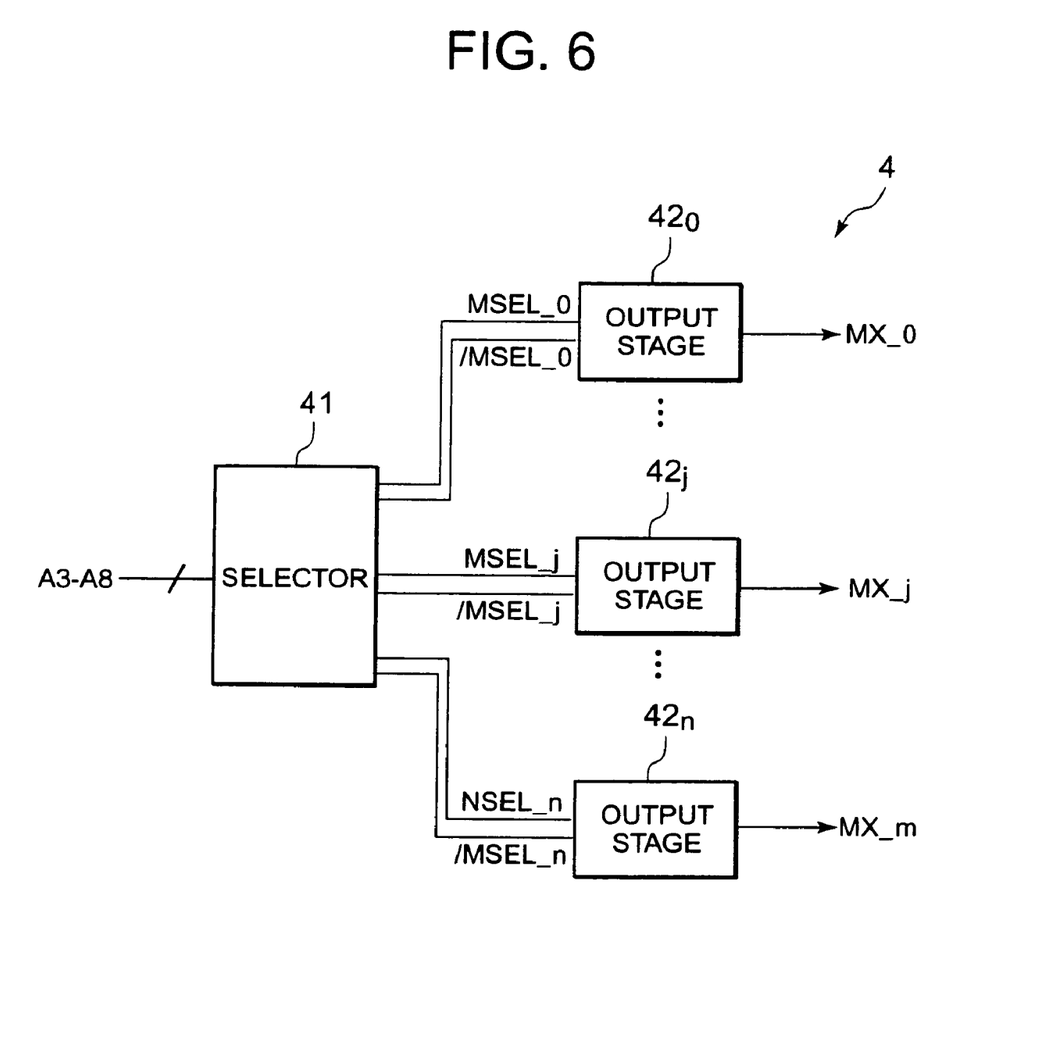
FIG. 6 is a block diagram showing a configuration of a main decoder according to the embodiment.

FIG. 6 is a block diagram showing a configuration of the main decoder 4. The main decoder 4 has a selector 41 and output stages $42_0$ to $42_m$. The selector 41 selects the main decode signals MX_0 to MX_m for the upper addresses A3 to A8. Specifically, when selecting the main decode signal MX_j, the selector 41 activates complementary selection signals MSEL_j and /MSEL_j (i.e., it pulls up the selection signal MSEL_j to a "High" level and pulls down the selection signal /MSEL_j to a "Low" level). The output stage $42_j$ generates a main decode signal MX_j in response to the selection signals MSEL_j and /MSEL_j.

Figure 7:
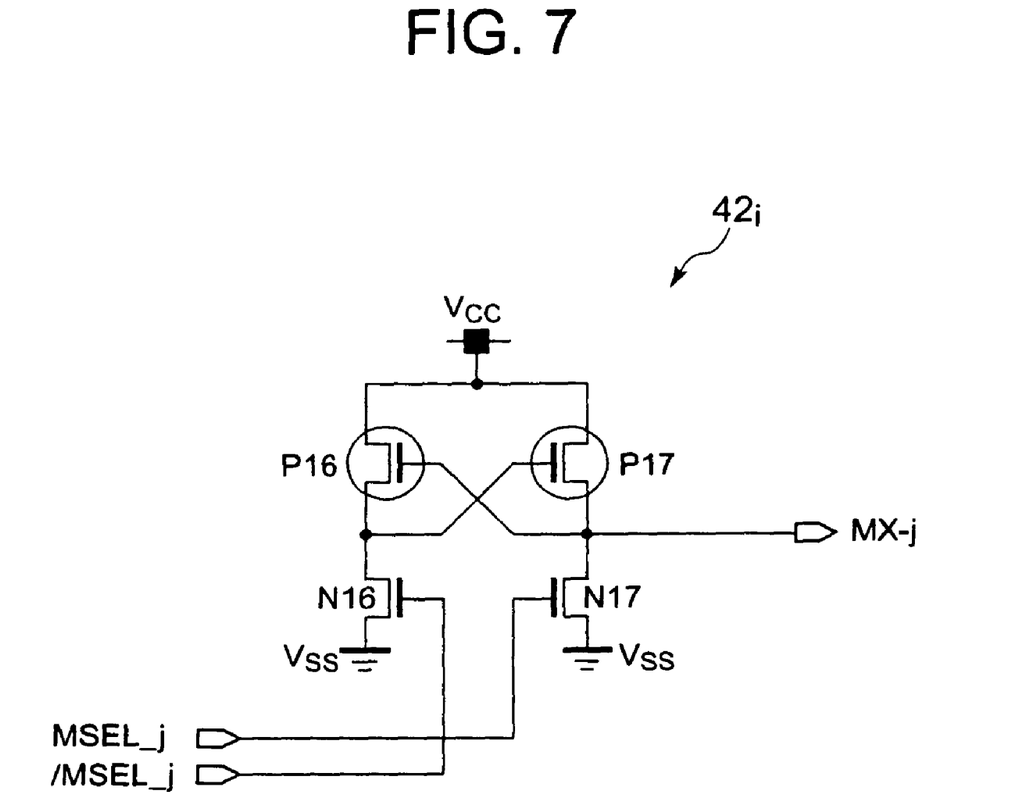
FIG. 7 is a circuit diagram showing a configuration of an output stage of the main decoder in FIG. 5.

FIG. 7 is a circuit diagram showing a configuration of the output stage $42_j$ of the main decoder 4. A level shifter consisting of four MOS transistors: PMOS transistors P16 and P17 and NMOS transistors N16 and N17 is used in the output stage $42_j$. The gates of the PMOS transistors P16 and P17 are connected to the drains of the other PMOS transistors. The sources of both PMOS transistors P16 and P17 are connected to a power supply terminal which has the power supply potential VCC. The drains of the PMOS transistors P16 and P17 are connected to the drains of the NMOS transistors N16 and N17, respectively. The gates of the NMOS transistors N16 and N17 are supplied with the selection signals /MSEL_j and MSEL_j, respectively. The sources of the NMOS transistors N16 and N17 are connected to a ground terminal which has the ground potential VSS. The main decode signal MX_j is outputted from the drains of the PMOS transistor P17 and NMOS transistor N17.

When the main decode signal MX_j is selected for the addresses A3 to A8 (i.e., when the selection signals MSEL_j and /MSEL_j are activated), the main decoder 4 configured as described above pulls down the main decode signal MX_j to the ground potential VSS. When the main decode signal MX_j is unselected, the main decoder 4 pulls up the main decode signal MX_j to the power supply potential VCC. It should be noted that the main decode signal MX_j is an active low signal.

Operation of Non-Volatile Semiconductor Storage Device

A feature of the non-volatile semiconductor storage device 10 according to this embodiment is that while each word line is driven by only two MOS transistors, no word line is brought into a floating state during its operation. This feature can be implemented as follows.

When the non-volatile semiconductor storage device 10 performs a write operation, the power lines VXPG1 and VXPG2 of the sub-decoder 2 are supplied with the high potential VPOS higher than the power supply potential VCC and the pull-down power line 24 (i.e., the source of the NMOS transistor N3 of the driver 22) is set to the ground potential VSS by the power switch 25.

Furthermore, desired pre-decode signals and main decode signals are selected for the addresses A0 to A8. A write operation of the non-volatile semiconductor storage device 10 will be described below, citing a case where the main decode signal MX_m and pre-decode signal PX_0 are selected, activating the word line WL_0_m (i.e., pulling it up to the high potential VPOS).

Figure 8:
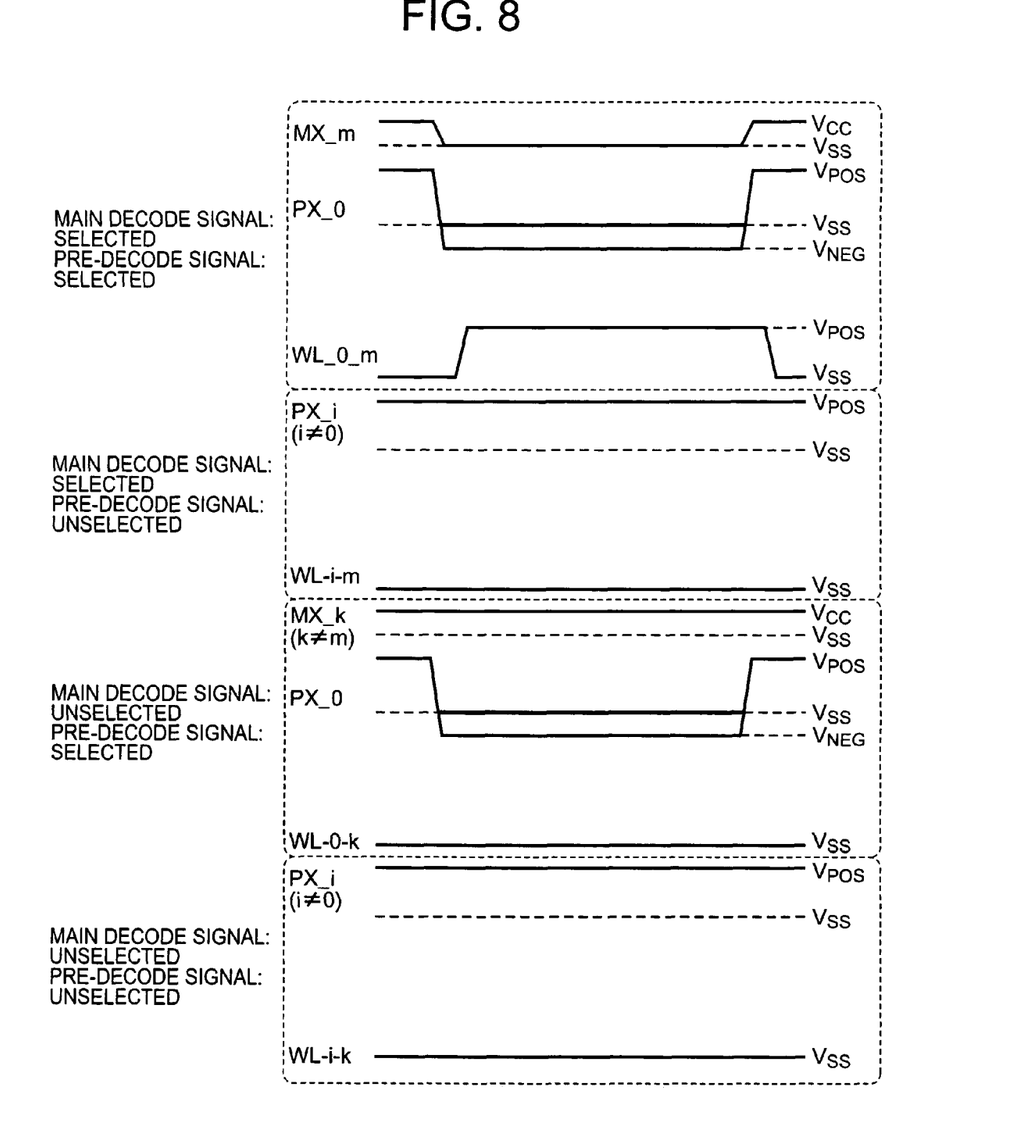
FIG. 8 is a timing chart showing operation of the non-volatile semiconductor storage device according to the embodiment.

When the main decode signal MX_m and pre-decode signal PX_0 are selected, the main decode signal MX_m is driven at the ground potential VSS and the pre-decode signal PX_0 is driven at the negative potential VNEG as shown at top of FIG. 8. Consequently, the pull-up power line $23_m$ is driven at the high potential VPOS and another pull-up power line $23_k$ (k≠m) is driven at the ground potential VSS. Furthermore, since the pre-decode signal PX_0 is pulled down to the negative potential VNEG, the PMOS transistor P3 of the driver 22-0-m turns on and the word line WL_0_m is connected to the pull-up power line $23_m$. Consequently, the word line WL_0_m is pulled up to the high potential VPOS.

At this time, the word lines other than the word line WL_0_m are kept at the ground potential VSS as described in detail below. First, description will be given of a word line WL_i_m (i≠0) for which the corresponding main decode signal is selected and pre-decode signal is unselected. Since the pre-decode signal PX_i is kept at the high potential VPOS, the NMOS transistor N3 of the driver 22-i-m is turned on. Consequently, the word line WL_i_m is connected to the pull-down power line 24 via the NMOS transistor N3. Since the pull-down power line 24 is set at the ground potential VSS in write operations, the word line WL_i_m is kept at the ground potential VSS.

Regarding a word line WL_0_k (k≠m) for which the corresponding main decode signal is unselected and pre-decode signal is selected, since the main decode signal MX_k is unselected, the pull-up power line $23_k$ is pulled down to the ground potential VSS. On the other hand, the pre-decode signal PX_0 has been pulled down to the negative potential VNEG. Thus, the PMOS transistor P3 of the driver 22-0-k turns on with its source supplied with the ground potential VSS, and its gate is supplied with the negative potential VNEG lower than the ground potential VSS. Consequently, the word line WL_0_k is connected to the pull-up power line $23_k$ via the PMOS transistor P3 and kept at the ground potential VSS.

Finally, regarding a word line WL_i_k (i≠m, k≠m) for which the corresponding main decode signal and pre-decode signal are both unselected, since the pre-decode signal PX_i is kept at the high potential VPOS, the NMOS transistor N3 of the driver 22-i-k is turned on. Consequently, the word line WL_i_k is connected to the pull-down power line 24 via the NMOS transistor N3. Since the pull-down power line 24 is set at the ground potential VSS in write operations, the word line WL-i-k is kept at the ground potential VSS.

In this way, in write operations, selected word lines are pulled up to the high potential VPOS while unselected word lines are kept at the ground potential VSS.

Read operations are performed in the same manner as write operations except that the power lines VXPG1 and VXPG2 of the sub-decoder 2 are supplied with the power supply potential VCC rather than the high potential VPOS. It will be self-apparent to those skilled in the art that selected word lines are pulled up to the power supply potential VCC while unselected word lines are kept at the ground potential VSS.

In erase operations, the pull-down power line 24 is pulled down to the negative potential VNEG by the power switch 25 while all the pre-decode signals and main decode signals remain unselected. Consequently, the sources of the NMOS transistors N3 of all the drivers 22 are pulled down to the negative potential VNEG. On the other hand, since the unselected pre-decode signals PX_0 to PX_n are pulled up to the high potential VPOS, the high potential VPOS is supplied to the gates of the NMOS transistors N3, turning on the NMOS transistors N3. Consequently, all the word lines WL_0_0 to WL_n_m are connected to the pull-down power line 24 and pulled down to the negative potential VNEG. Again, no word line is brought into a floating state.

In this way, with the non-volatile semiconductor storage device 10 according to this embodiment, each word line is driven by only two MOS transistors, but no word line is brought into a floating state during its operation. This is suitable for reducing the size of the non-volatile semiconductor storage device 10 and stabilizing its operation effectively.

Figure 9:
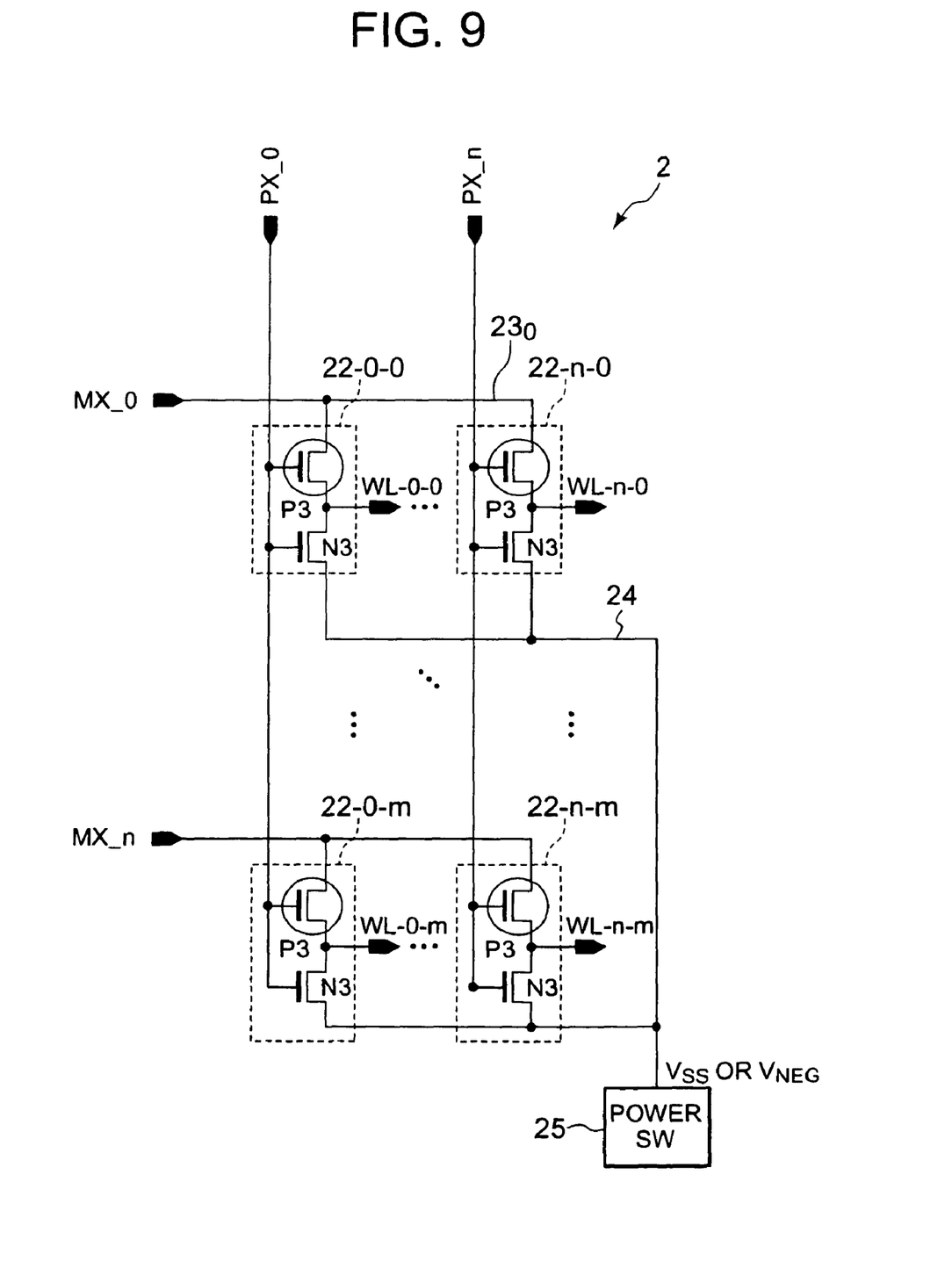
FIG. 9 is a circuit diagram showing a configuration of a sub-decoder according to another embodiment.

A preferred embodiment of the present invention has been described in detail, but the present invention is not limited to the above embodiment. For example, as shown in FIG. 9, the main decode signals MX_0 to MX_m may be supplied directly to the pull-up power lines $23_0$ to $23_m$ (i.e., the sources of the PMOS transistors P3 of the drivers 22). In that case, the level shifters $21_0$ to $21_m$ are eliminated from the sub-decoder 2 and the main decode signals MX_0 to MX_m are set to be active high. Specifically, when the sub-decoder 2 is configured as shown in FIG. 9, selected main decode signals MX_j are driven at the high potential VPOS in write operations, and at the power supply potential VCC in read operations. Unselected main decode signals MX_j are driven at the ground potential VSS. Also, the output stages $42_j$ of the main decoder 4 are configured such that the main decode signals MX_0 to MX_m will be active high.

However, it is more preferable that the main decode signals MX_0 to MX_m are supplied to the level shifters $21_0$ to $21_m$ of each sub-decoder 2 and the pull-up power lines $23_0$ to $23_m$ are driven by the level shifters $21_0$ to $21_m$, as is the case with this embodiment. This is because such configurations reduce loads on both output stages $42_j$ (i.e., circuits which generate the main decode signals MX_0 to MX_m) and level shifters $21_0$ to $21_m$, making it possible to drive word lines in a short time. With a configuration in which the main decode signals MX_0 to MX_m are supplied directly to the pull-up power lines $23_0$ to $23_m$, the output stages $42_j$ of the main decoder 4 must drive the PMOS transistors P3 of many drivers 22. This will increase the load on the output stages $42_j$ and unwantedly increase the time required to drive the word lines.

What is claimed is:

1. A non-volatile semiconductor storage device, comprising:
   a memory array including memory cells;
   a plurality of word lines installed in the memory array, for controlling gates of said memory cells;
   a sub-decoder including a pull-up power line, a pull-down power line, and a plurality of drivers, said drivers permitting said sub-decoder to selectively drive word lines in accordance with a pre-decode signal and a main decode signal;
   a pre-decoder, coupled to the sub-decoder, and generating said pre-decode signal in accordance with a first group of address bits; and
   a main decoder, coupled to the sub-decoder, and generating said main decode signal in accordance with a second group of address bits, a potential of the pull-up power line and a potential of the pull-down power line being controlled in response to the main decode signal,
   wherein the pre-decoder provides a first voltage as the pre-decode signal when the first group of address bits is selected and a second voltage as the pre-decode signal when the first group of address bits is unselected, said first voltage and said second voltage being predetermined so that word lines are positively provided a voltage regardless of whether a word line is selected or unselected,
   wherein one of said first voltage and said second voltage comprises a negative potential lower than a ground potential.

2. The non-volatile semiconductor storage device according to claim 1, wherein, if the main decode signal is unselected and the pre-decode signal is selected when a write operation or a read operation is performed, the main decoder sets the potential of the pull-up power line at the ground potential and the pre-decoder pulls down the pre-decode signal to the negative potential lower than the ground potential.

3. The non-volatile semiconductor storage device according to claim 2,
   wherein the pull-down power line is driven at the ground potential when the write operation or read operation is performed,
   wherein the pre-decoder pulls up the pre-decode signal to a positive potential higher than the ground potential if the pre-decode signal is unselected when the write operation or read operation is performed.

4. The non-volatile semiconductor storage device according to claim 3, wherein, if both the main decode signal and pre-decode signal are selected when the write operation or read operation is performed, the main decoder sets the potential of the pull-up power line at a positive potential higher than the ground potential and the pre-decoder pulls down the pre-decode signal to a negative potential lower than the ground potential.

5. The non-volatile semiconductor storage device according to claim 4, wherein, when an erase operation is performed, the pre-decoder pulls up the pre-decode signal to a positive potential higher than the ground potential and the pull-down power line is driven to the negative potential lower than the ground potential.

6. The non-volatile semiconductor storage device according to claim 1,
   wherein the sub-decoder comprises a first sub-decoder, the non-volatile semiconductor storage device further comprising a second sub-decoder,
   wherein the main decode signal comprises a first main decode signal, corresponding to the first sub-decoder,
   wherein the main decoder further generates a second main decode signal, corresponding to the second sub-decoder,
   wherein the first sub-decoder comprises a first level shifter which drives a pull-up power line of the first sub-decoder in response to the first main decode signal, and
   wherein the second sub-decoder comprises a second level shifter which drives a pull-up power line of the second sub-decoder in response to the second main decode signal.

7. The non-volatile semiconductor storage device according to claim 1, wherein the sub-decoder comprises a level shifter which drives the pull-up power line in response to the main decode signal.

8. The non-volatile semiconductor storage device according to claim 1,
   wherein the pull-up power line comprises a first pull-up power line,
   wherein the sub-decoder comprises:
      a second pull-up power line;
      a first level shifter corresponding to drivers that are coupled to the first pull-up power line; and a second level shifter corresponding to drivers that are coupled to the second pull-up power line, wherein the main decode signal comprises a first main decode signal, wherein the main decoder further generates a second main decode signal, wherein the first level shifter drives the first pull-up power line in response to the first main decode signal, and wherein the second level shifter drives the second pull-up power line in response to the second main decode signal.

9. The non-volatile semiconductor storage device according to claim 8, wherein the pre-decode signal comprises a first pre-decode signal coupled to at least one driver of the plurality of the drivers, and wherein the pre-decoder generates a second pre-decode signal coupled to drivers which is not coupled to the first pre-decode signal.

10. The non-volatile semiconductor storage device according to claim 1, wherein the pre-decoder comprises a buffer including a first power supply node which is supplied with a negative potential and a second power supply node which is supplied with a positive potential, and wherein the buffer generates a potential corresponding to the negative potential and a potential corresponding to the positive potential based on an address signal.

11. The non-volatile semiconductor storage device according to claim 10, wherein the pre-decoder comprises a negative voltage level shifter which generates a signal of a negative potential, and wherein the buffer is controlled by the signal of the negative potential.

12. The non-volatile semiconductor storage device according to claim 11, wherein the pre-decoder comprises a positive voltage level shifter which generates a signal of a positive potential, and wherein the buffer is controlled by the signal of the positive potential.

13. The non-volatile semiconductor storage device of claim 1, wherein each of the plurality of drivers comprises:

a first transistor including a first node which is coupled to the pull-up power line, a second node which is coupled to one of the plurality of word lines and a third node which is supplied with the pre-decode signal; and a second transistor including a fourth node which is coupled to the pull-down power line, a fifth node which is coupled to the second node and a sixth node which is supplied to the pre-decode signal.

14. The non-volatile semiconductor storage device of claim 1, wherein one of said first voltage and said second voltage is negative so that a driver receiving said negative voltage drives its word line to a ground potential, said pre-decoder thereby ensuring that no word lines in said memory array are left in a floating state, including word lines that are unselected.

15. A method for driving word lines using drivers, each of the drivers including a first transistor and a second transistor, the first transistor including a first node which is coupled to a pull-up power line and a second node which is coupled to one of the word lines, the second transistor including a third node which is coupled to the second node and a fourth node which is coupled to a pull-down power line, the method comprising:

supplying a pre-decode signal corresponding to one of the word lines to gates of both the first transistor and the second transistor by pulling down the pre-decode signal to a negative potential lower than a ground potential when the pre-decode signal is selected;

supplying the pre-decode signal to gates of both the first transistor and the second transistor by pulling up the pre-decode signal to a positive potential higher than the ground potential when the pre-decode signal is unselected;

pulling up the pull-up power line to a positive potential when a main decode signal corresponding to one of the word lines is selected; and pulling down the pull-up power line to the ground potential when the main decode signal is unselected.

16. A semiconductor device, comprising:

a plurality of sub-decoder circuits provided for respective word lines;

a plurality of main decoder circuits provided for respective groups of sub-decoder circuits; and a plurality of pre-decoder circuits provided for respective groups of predetermined sub-decoder circuits, wherein each of the sub-decoder circuit comprises a first transistor and a second transistor, the first transistor being supplied with a first potential or a second potential, and the second transistor being supplied with the second potential, wherein each of the pre-decoder circuits generates a first pre-decode signal and a second pre-decode signal, wherein a potential of the first pre-decode signal comprises a positive potential higher than a ground potential, wherein a potential of the second pre-decode signal comprises a negative potential lower than the ground potential, and wherein gates of both the first transistor and the second transistor are supplied with the first pre-decode signal and the second pre-decode signal.

17. The semiconductor device according to claim 16, wherein each of the main decoder circuits generates a first main decode signal and a second main decode signal, wherein the first transistor supplies the first potential to the word line using the second pre-decode signal and the first main decode signal, and supplies the second potential to the word line using the second pre-decode signal and the second main decode signal, and wherein the second transistor supplies the second potential to the word line using the first pre-decode signal.

18. The semiconductor device according to claim 17, wherein the first potential is a positive voltage and the second potential is lower than the first voltage.

19. The non-volatile semiconductor storage device according to claim 16, wherein each of the pre-decoder circuits comprises a buffer including a first power supply node which is supplied with a negative potential and a second power supply node which is supplied with a negative potential, and wherein the buffer generates a potential corresponding to the negative potential and a potential corresponding to the positive potential based on a address signal.

20. The non-volatile semiconductor storage device according to claim 19, wherein the pre-decoder comprises:

a negative voltage level shifter which generates a signal of a negative potential; and a positive voltage level shifter which generates a signal of a positive potential, wherein the buffer is controlled by the signal of the negative potential and the signal of the positive potential.

* * * * *